United States Patent
Servin

(10) Patent No.: US 12,050,255 B2
(45) Date of Patent: Jul. 30, 2024

(54) MAGNETICALLY ACTIVATED ACOUSTIC NANOTRACERS

(71) Applicant: SAUDI ARABIAN OIL COMPANY, Dhahran (SA)

(72) Inventor: Jesus Manuel Felix Servin, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 184 days.

(21) Appl. No.: 17/652,246

(22) Filed: Feb. 23, 2022

(65) Prior Publication Data

US 2023/0266412 A1  Aug. 24, 2023

(51) Int. Cl.
*G01R 33/12* (2006.01)
*G01N 27/74* (2006.01)

(52) U.S. Cl.
CPC ......... *G01R 33/1276* (2013.01); *G01N 27/74* (2013.01)

(58) Field of Classification Search
CPC .............. G01R 33/543; G01R 33/5608; G01R 33/4828; G01R 33/3415; G01R 33/283; G01R 33/307; G01R 33/60; G01R 33/1276; G01V 3/32; E21B 49/08; E21B 2049/085; G01N 24/10; G01N 27/74
See application file for complete search history.

(56) References Cited

U.S. PATENT DOCUMENTS

| 10,261,216 B2 | 4/2019 | Chang et al. | |
| 2005/0175541 A1* | 8/2005 | Lanza | A61K 9/0009 424/9.5 |
| 2006/0048937 A1* | 3/2006 | Pinto | E21B 43/119 166/255.2 |
| 2009/0200021 A1* | 8/2009 | Pinto | E21B 47/024 166/255.2 |

(Continued)

FOREIGN PATENT DOCUMENTS

WO  2021136949 A1  7/2021

OTHER PUBLICATIONS

Teng et al.; "A magnetic droplet vaporization approach using perfluorohexane-encapsulated magnetic mesoporous particles for ultrasound imaging and tumor ablation", Biomaterials; vol. 134; Apr. 15, 2017; pp. 43-50 (8 pages).

(Continued)

*Primary Examiner* — Jermele M Hollington
*Assistant Examiner* — Taqi R Nasir
(74) *Attorney, Agent, or Firm* — Osha Bergman Watanabe & Burton LLP

(57) ABSTRACT

A tracer composition includes a carrier fluid and a tracer particle that includes at least one magnetic material and an acoustic signal generating material. A method includes introducing a tracer composition into a reservoir at a first location. The method further includes collecting fluid from the reservoir at a second location, where the first location is different from the second location. The method also includes applying a magnet field to the fluid collected from the reservoir such that the magnetic material produces vibra- (Continued)

tional energy. Due to the vibrational energy generated in the magnetic material, thermal energy is transferred to the acoustic signal generating material thereby heating the acoustic signal generating material to a boiling point such that the acoustic signal is generated. The method further includes detecting the acoustic signal and correlating the acoustic signal to a tracer particle concentration.

20 Claims, 7 Drawing Sheets

(56) References Cited

U.S. PATENT DOCUMENTS

2014/0000357 A1    1/2014  Pissarenko et al.
2019/0049624 A1*   2/2019  Chang .................. E21B 47/11
2021/0106841 A1*   4/2021  Jiang .................... A61N 2/12

OTHER PUBLICATIONS

Zhou et al.; "Magnetic nanoparticle-promoted droplet vaporization for in vivo stimuli-responsive cancer theranostics", NPG Asia Materials; vol. 8; No. e313; Sep. 23, 2016; pp. 1-8 (8 pages).
Thi et al.; "Functionalized mesoporous silica nanoparticles and biomedical applications", Materials Science & Engineering C; vol. 99; Jun. 2019; pp. 631-656 (26 pages).
Zullino et al.; "Superparamagnetic Oxygen-Loaded Nanobubbles to Enhance Tumor Oxygenation During Hyperthermia", Frontiers in Pharmacology; vol. 10; No. 1001; Sep. 11, 2019; pp. 1-10 (10 pages).

* cited by examiner

MAGNETICALLY ACTIVATED ACOUSTIC NANOTRACERS

BACKGROUND

An inter-well petroleum reservoir is multi-well reservoir of an underground collection of hydrocarbon compounds that is accessed through at least two boring sites in the surface of the earth. One of the main ways to facilitate delivery of the hydrocarbons to the surface is through water flooding. Water-based fluid injection takes place at one designated reservoir location, and desired extractants may be collected at a different locale of the reservoir. Inter-well tracers and corresponding techniques have often been employed to determine the fluid flow paths between these sites, as well as fluid flow rates and capacity. Tracers enhanced with dual functionality with magnetic materials and acoustic signal generating materials address various challenges with previously formulated tracers.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter. In one aspect, embodiments disclosed herein relate to a tracer composition including a tracer particle and a carrier fluid. The tracer particles include at least one magnetic material and an acoustic signal generating material.

In another aspect, embodiments disclosed herein relate to a method that includes introducing a tracer composition into a reservoir at a first location. The tracer composition includes a carrier fluid and a tracer particle including at least one magnetic material and an acoustic signal generating material. The method further includes collecting fluid from the reservoir at a second location, wherein the first location is different from the second location, and applying a magnet field to the fluid collected from the reservoir such that the magnetic material produces vibrational energy. Due to the vibrational energy generated in the magnetic material, thermal energy is transferred to the acoustic signal generating material thereby heating the acoustic signal generating material to a boiling point of the acoustic signal generating material such that the acoustic signal is generated. Finally, the method includes detecting the acoustic signal and correlating the acoustic signal to a tracer particle concentration.

Other aspects and advantages of the claimed subject matter will be apparent from the following description and the appended claims.

DETAILED DESCRIPTION

Figure 1A:
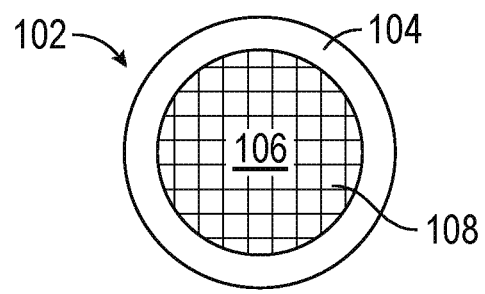
FIG. 1A-1D are depictions of a chemical tracer particle in accordance with one or more embodiments.

Embodiments of the present disclosure generally relate to an inter-well tracer material and a magnetic field-based detection method. The tracers are comprised of a magnetic material and an acoustic signal generating material. In one or more embodiments, the tracers may have an outer layer to contain the acoustic signal generating material and the magnetic material while in an oil-bearing formation. In one or more embodiments, the outer layer may be a magnetic material. In other embodiments, the outer layer of the tracer may be an inert and structurally stable material.

The disclosed tracers may be used to determine reservoir properties via an inter-well chemical tracer test. In one or more embodiments, the tracers may be injected into the reservoir at an injection location. Due to the structurally stable material of the tracer particles, they remain stable in the reservoir. The tracer particles may follow fluid flow paths once injected into the formation. In such embodiments, tracers may be collected (or "produced") from at least one producing location, thus allowing for the evaluation and comparison of fluid flow paths that span from each of the injection location to the producing location.

In one or more embodiments, the detection method subjects the collected fluid to an alternating current magnetic field. The tracers may be formulated as particles. The tracer particles may generate an acoustic signal upon magnetic droplet vaporization. In one or more embodiments, the alternating current magnetic field may provide sufficient energy to the magnetic components of the tracers to increase the temperature of the magnetic component. The increase in the temperature of the magnetic component may then activate vaporization of the acoustic signal generating material. The process of vaporization initiated by a magnetic field may be referred to herein as "magnetic droplet vaporization." This process may generate an acoustic signal due to the phase change of the acoustic signal generating material from liquid to gas. The generated acoustic signal may be identified and recorded using at least one acoustic transducer, and the signal may be compared against a calibration curve to determine tracer particle concentration.

The present disclosure relates to compositions and methods for inter-well tracer tests for fluid flow analysis in oil and gas reservoirs. The tracers may be introduced into a well in a single step, and after collection from a production well, an acoustic signal generating material incorporated in the tracer particles may be controllably activated via magnetic droplet vaporization to release an acoustic signal. The disclosed compositions may lead to more stable tracer particles and simplified procedures as compared to conventional methods. Tracers that are detected using magnetic droplet vaporization may allow for more precise collection of data as compared to conventional chemical tracers because there are few interfering signals from additional compounds in the collected fluids. In contrast, methods that use fluorescent tracers, for example, may have significant background interference from florescence generated from hydrocarbons in the sample. Therefore, the compositions and methods disclosed herein may provide improved inter-well chemical tracer data as compared to conventional methods.

Inter-Well Chemical Tracer Composition

One or more embodiments of the present disclosure relate to an inter-well chemical tracer composition. The disclosed composition includes an aqueous fluid and a tracer particle. The tracer particle may include a magnetic material and an acoustic signal generating material. In one or more embodiments, the acoustic signal generating material generates an acoustic signal upon activation of the tracer particle.

The tracer particle disclosed herein includes an outer layer that maintains the acoustic signal generating material within the particle while it is in the reservoir. In one or more embodiments, the tracer particle may have a structure of a core/shell particle. A simplified depiction of a particle in accordance with such embodiments of the present disclosure is shown in FIG. 1A. The particle 102 has an outer layer 104 (or "shell") and a core 108. In one or more embodiments, the acoustic signal generating material 106 is located in the core 108 which is surrounded by a shell 104. In such embodiments, the acoustic signal generating material is maintained in the core of the shell such that it will not be released while inside the reservoir. The simplified schematic in FIG. 1A depicts a non-porous material having a uniform size and shape, however, the size and shape of the material are not particularly limited and may be varied and/or irregular.

As noted above, in one or more embodiments, the particle includes an outer layer. The outer layer or "shell" of the core/shell particle may be a magnetic material that functions as a magnetic shell of the particle. Suitable magnetic materials include magnetic materials that are stable under room temperature and pressure conditions as well as increased temperature and pressure such that the nanoparticles may withstand local conditions in a reservoir.

In one or more embodiments, local conditions of the reservoir may include elevated temperature, elevated pressure, acidic conditions, high salinity, and combinations thereof. As environmental conditions vary from reservoir to reservoir, the tracer particles may have suitable stability to withstand external stimuli in the reservoir. In such embodiments, the tracer particles may be stable under the elevated temperature conditions in a range from 60° C. to 120° C., elevated salinity up to 200,000 ppm total dissolved solids, and a pH range from about 4 to 8. In addition, the tracer particles may be stable in a time frame of several weeks to several months.

In one or more embodiments, the magnetic material may be selected for targeted magnetic properties, such as high saturation magnetization within the tracer particle, to promote magnetic droplet vaporization in the phase contrast agent to generate an acoustic signal. High saturation magnetization of a magnetic material may be dependent upon at least one characteristics of the tracer particle. In such embodiments, the at least one characteristic of the tracer particle may include the type of magnetic material, the size of the tracer particle, such as a diameter size of the tracer particle, the shape of the tracer particle, the type of acoustic signal generating material encapsulated in the tracer particle, and combinations thereof.

The high saturation magnetization may be in a range of 20 electromagnetic units per gram (emu $g^{-1}$) to 100 emu $g^{-1}$. The high saturation magnetization may have a lower limit of one of 20, 25, 30, 35, 40, 45, 50, 55, 60, 65, and 75 emu $g^{-1}$ and an upper limit of one of 40, 45, 50, 55, 60, 75, 95, 99, and 100 emu $g^{-1}$, where any lower limit may be paired with any mathematically compatible upper limit.

In one or more embodiments, the magnetic material may be made of selected magnetic elements, such as manganese, cobalt, iron, neodymium, gadolinium, dysprosium, and combinations thereof. These metal elements may be complexed with ligands or be oxidized to form their respective oxides including, but not limited to, manganese oxide, iron oxide, neodymium oxide, gadolinium oxide, and combinations thereof.

Figure 1B:
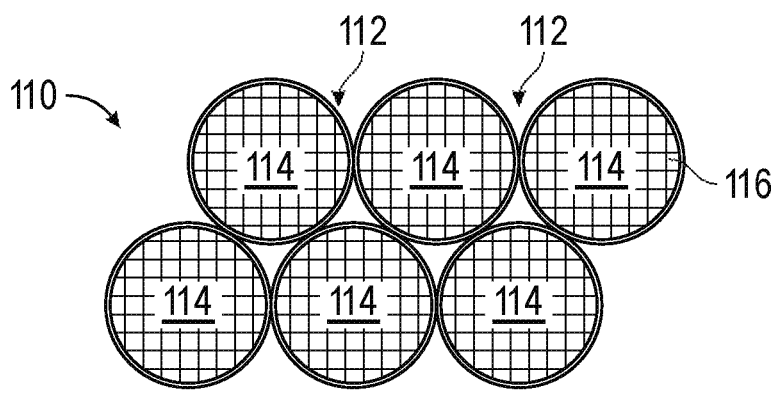

In one or more embodiments, the outer layer may have a mesoporous structure. In such embodiments, as shown in FIG. 1B, the mesoporous structure 110 is a network of at least two core/shell structures. The network of core/shell structures are connected through a physical linkage 112 of a shell material. Each core/shell structure forms a pore 114 of the mesoporous structure. In one or more particular embodiments, the shell material may also be the magnetic material. In such instances, the mesoporous material may be produced in a way that the acoustic signal generating material 116 is encapsulated in the pores 114. As used herein, the term "mesoporous" refers to a porous material having pore diameter sizes ranging from about 2 to 50 nm.

In other embodiments, the outer layer of the tracer particle is made of an inert material. In such embodiments, the inert material is non-magnetic and is structurally stable such that it can withstand reservoir fluid flow conditions without being ruptured or damaged. Non-limiting examples of the inert shell material are silica, methylmethacrylate, ethylcyanoacrylate, and butylcyanoacrylate.

Outer layers of the tracer particles in accordance with one or more embodiments have a thickness that may be tuned to produce a rupture of the outer layer within the collected fluid. As may be appreciated by those skilled in the art, a particle with a thinner outer layer may rupture more easily than one with a thicker outer layer. As such, depending upon formation conditions, the outer layer may be appropriately designed to promote a sufficient acoustic signal upon collection of the fluid from a targeted location.

In one or more embodiments, the outer layer may have a thickness of from about 5 nm to about 50 nm. The outer layer thickness may have a lower limit of one of 5, 10, 15, 20, 30, 40 and 45 nm and an upper limit of one of 30, 40, 45 and 50 nm, where any lower limit may be paired with any mathematically upper limit.

Figure 1C:
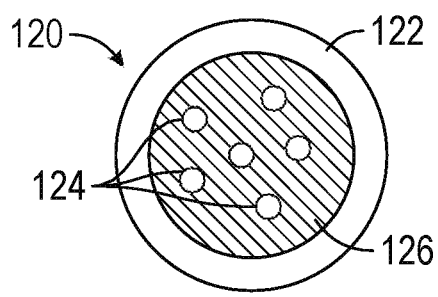
Figure 1D:
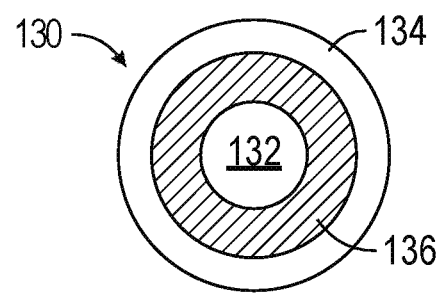

In embodiments in which the tracer particle has a core/shell structure, the core may include the acoustic generating material, and, in some embodiments, the core may include other components in addition to the acoustic generating material. In some embodiments, the core consists of an acoustic generating material alone, and has a structure as shown in FIG. 1A. In one or more embodiments, the core of the tracer particle 120 may include acoustic signal generating material 126 that suspends the magnetic material 124 (FIG. 1C). In such embodiments, the shell 122 of the core/shell tracer particle 120 may be a magnetic material or an inert shell material. Another embodiment of the tracer particle 130 is shown in FIG. 1D. The outer layer of material 134 (i.e., the shell) may be used to contain core materials as explained above. In the embodiment shown in FIG. 1D, the core may include a magnetic particle 132 and an acoustic signal generating material 136. As mentioned above with regard to FIGS. 1A, FIGS. 1B, 1C, and 1D depict the tracer particle and the tracer core having a uniform size and shape, however, the size and shape of the material are not particularly limited and may be varied and/or irregular.

The tracer particle may include a core including an acoustic signal generating material so as to produce an acoustic signal. An acoustic signal generating material in accordance with the present disclosure emits an acoustic signal upon phase change during magnetic droplet vaporization. During this process, an acoustic signal is produced when the acoustic signal generator undergoes a phase transition, such as a phase transition from liquid to gas. The acoustic signal generating material emits an acoustic signal that may be detected by an acoustic signal transducer. The acoustic signal may be in the ultrasonic range, such as from about 1 to 100 MHz (Megahertz).

Core materials disclosed herein are materials that have a suitable boiling point and generate an acoustic signal when they undergo a phase change from liquid to gas. In such embodiments, the acoustic signal generating material includes, but is not limited to, a perfluorocarbon selected from the group consisting of perfluorohexane, perfluorohexyl bromide, perfluorooctyl bromide, perfluoro-15-crown-5-ether, and combinations thereof.

Suitable core materials are those that have a boiling point ranging from 50 to 150° C. The boiling point of the suitable core materials may have a lower limit of one of 50, 55, 65, 75, 100, and 125° C. and an upper limit of one of 75, 85, 95, 115, 125, 145, and 150° C., where any lower limit may be paired with any mathematically upper limit. As one generally skilled in the art may appreciate, the boiling point of the acoustic signal generating material increases as the number of carbons of the acoustic signal generating material increases. In one or more exemplary embodiments, a combination of two or more acoustic signal generating materials may be used to achieve a specific boiling point range.

The boiling point ranges recited above are the boiling points for bulk acoustic signal generating material. However, the boiling points of the acoustic signal generating materials disclosed herein may be tuned by decreasing the droplet size of the acoustic signal generating material, creating a larger surface to volume ratio. Increasing the surface to volume ratio may increase the boiling point of the acoustic signal generating material such that it is suitable for downhole applications.

In one or more embodiments, the boiling points of the acoustic signal generating material may be, in part, due to the surface tension provided by the surrounding shell. The core-shell structure of nanodroplets of the acoustic signal generating material may provide a pressure difference, known as Laplace pressure, between the inside and outside of the shell of the tracer particles of the present disclosure. Laplace pressure may be described according to Equation 1, below.

$$\Delta P = P_{in} - P_{out} = \frac{2}{R}\gamma \qquad \text{Eq. 1}$$

In Equation 1, R is the radius and y is the interfacial tension of an acoustic signal generating material nanodroplet. Accordingly, it can be appreciated that the Laplace pressure may become greater in smaller nanodroplets and at higher interfacial tensions. As derived from Equation 1, the pressure inside disclosed superheated phase-changing nanodroplets may be calculated according to Equation 2, below.

$$P_{in} = P_{out} + \frac{2}{R}\gamma \qquad \text{Eq. 2}$$

In one or more embodiments, the temperature at which a phase-changing nanodroplet may vaporize at a known pressure may be estimated according to the Antoine equation, shown below.

$$T = \frac{B}{A - \log_{10}p} - C \qquad \text{Eq. 3}$$

In Equation 3, A, B, and C are component-specific constants that may be obtained empirically. As shown in Equation 3, a liquid at high pressure may have a boiling point that is higher than the same liquid in ambient conditions. The pressure inside the acoustic signal generating material nanodroplets of one or more embodiments may be elevated. In such embodiments, the liquid acoustic signal generating material cores of the core/shell particle may have boiling points higher than that of the same acoustic signal generating material in bulk at ambient pressure. Accordingly, the pressure differential may allow the core to remain in liquid state (where in a free environment, the core may otherwise be in a gas state), and the liquid core may remain stable until exposed to an external stimulus such as an increase in temperature resulting from heating of the magnetic material of the tracer particles.

In one or more embodiments, the boiling point of the acoustic signal generating material may be reduced by increasing the diameter of the tracer particle. In such embodiments, the average diameter of the tracer particle may be in a range of 100 nm to 1000 nm. The average diameter of the tracer particle may have a lower limit of one of 100, 200, 250, 300, 350, 400, 450, and 500 nm and an upper limit of one of 350, 400, 450, 500, 550, 600, 650, 700, 750, 800, 850, 900, 950, and 1000 nm, where any lower limit may be paired with any mathematically upper limit.

In one or more embodiments, the disclosed core/shell particles may include a suitable amount of encapsulated acoustic signal generating material. In some embodiments, the core/shell particle may include from 10 vol % (volume percent) to 30 vol % of at least one acoustic signal generating material based on the total volume of the tracer particle. The core/shell particle may include the at least one acoustic signal generating material in an amount having a lower limit of one of 10, 12, 15, 17, 20, and 25 vol % and an upper limit of one of 10, 12, 15, 17, 20, 25, 29 and 30 vol %, where any lower limit may be paired with any mathematically compatible upper limit.

In one or more embodiments, the disclosed core/shell particles may include a suitable amount of the magnetic material to induce magnetic droplet vaporization when exposed to a magnetic field. In some embodiments, the core/shell particle may include from about 50 vol % to 90 vol % of the magnetic material based on the total volume of the tracer particle. The core/shell particle may include the magnetic material in an amount having a lower limit of one of 50, 55, 60, 65, 70, and 75 vol % and an upper limit of one of 65, 70, 75, 80, 85 and 90 vol %, where any lower limit may be paired with any mathematically compatible upper limit.

Figure 2:
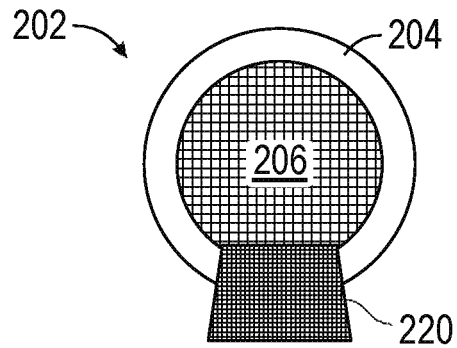
FIG. 2 is a depiction of ruptured chemical tracer particle in accordance with one or more embodiments.

As will be explained in greater detail below, tracer particles in accordance with the present disclosure may rupture to promote the release of an acoustic signal upon the phase change of the acoustic signal generating material that is encapsulated in the nanoparticle. A ruptured core/shell particle 202 is shown in FIG. 2. As used herein, "rupture" means that the outer layer of the particle has been altered such that the outer layer material no longer completely coats the surface of the particle. A rupture may include alteration to only a portion of the shell. When the shell 204 has been ruptured, the acoustic signal generating material 220 may generate an acoustic signal by undergoing a phase change from liquid to gaseous state from the core 206 of the particle 202 into the surrounding environment.

As previously described, the tracer particle includes materials to contain at least one acoustic signal generating material that produces an acoustic signal, such as an acoustic signal generating material. In some embodiments, the tracer particle may be a suitable size for use in an inter-well chemical tracer test. In particular, the average diameter of the tracer particle may be less than 1000 nm allowing for transport of the core/shell particles through a multi-well reservoir.

Magnetic materials within the core of the tracer particles in accordance with one or more embodiments may have a mesoporous structure. As may be appreciated by those skilled in the art, a magnetic material with a higher surface area in contact with the acoustic signal generating material may provide a higher degree of thermal energy transfer. As such, depending upon the conditions of the magnetic field, the magnetic materials may be appropriately designed to promote or delay a magnetic droplet vaporization event upon collection of the fluid from a targeted location. The magnetic material may have an appropriate surface chemistry in a given chemical system, to promote or delay thermal energy transfer to the acoustic signal generating material.

As noted above, the tracer composition in accordance with one or more embodiments of the present disclosure includes a carrier fluid. The carrier fluid may be an aqueous fluid. The aqueous fluid is provided to disperse the tracer particles for injection into the well. The aqueous fluid includes water. The water may be distilled water, deionized water, tap water, fresh water from surface or subsurface sources, production water, formation water, natural and synthetic brines, brackish water, natural and synthetic sea water, black water, brown water, gray water, blue water, potable water, non-potable water, other waters, and combinations thereof, that are suitable for use in a wellbore environment. In one or more embodiments, the water used may naturally contain contaminants, such as salts, ions, minerals, organics, and combinations thereof, as long as the contaminants do not interfere with the tracer particle operations. In one or more embodiments, viscosifiers, polymers, surfactants, and combinations thereof may be added to the aqueous fluid to enhance the dispersion stability of the tracers in the fluid. Suitable surfactants may include anionic surfactants, cationic surfactants, and zwitterionic surfactants known in the art. Non-limiting examples of viscosifiers include xanthan gum, polymers commonly used in enhanced oil recovery operations, such as AN-132, and combinations thereof.

The tracer particles may be included in the carrier fluid in a suitable amount such that injection into the well is not inhibited. In such instances, the concentration of tracer particles in the carrier fluid may be in a range from 0.5 to 5.0 wt % of the injection fluid composition. The tracer particle concentration may have a lower limit of one of 0.5, 1.0, 1.5, 2.0, 2.5 and 3.0 wt % and an upper limit of one of 2.5, 3.0, 3.5, 4.0, 4.5 and 5.0 wt %, where any lower limit may be paired with any mathematically compatible upper limit.

Method of Making a Chemical Tracer Composition

Figure 3:
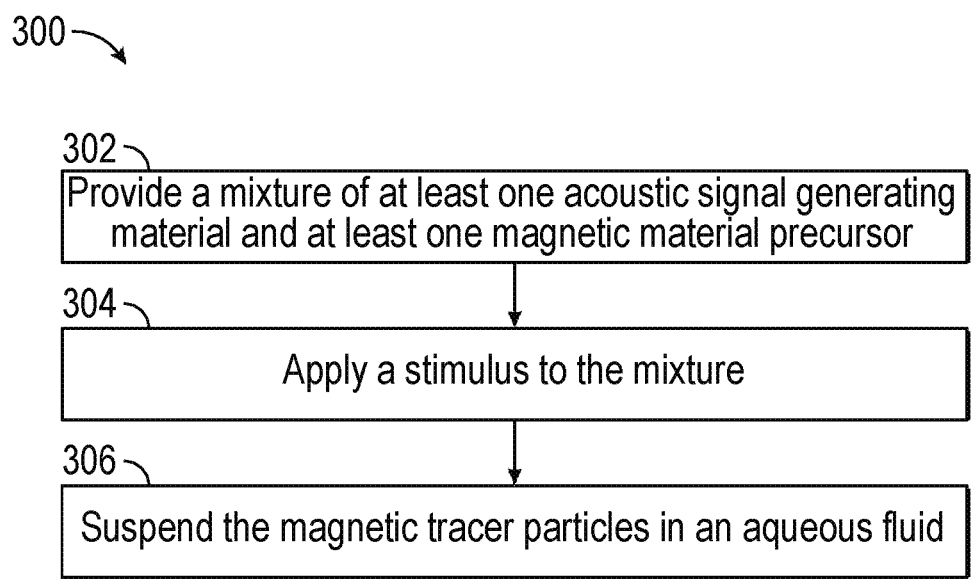
FIG. 3 is a block flow diagram of a method of making a chemical tracer composition in accordance with one or more embodiments.

One or more embodiments of the present disclosure relate to a method of making the previously described inter-well chemical tracer composition. An exemplary method 300 is shown in FIG. 3. The method may include providing a mixture of at least one acoustic signal generating material and at least one magnetic material precursor 302. The acoustic signal generating materials are as previously described. The magnetic material precursor may be a magnetic material or a precursor that may be converted to a magnetic material as described below. The acoustic signal generating materials and magnetic materials may be combined with optional materials to prepare the mixture. The optional materials may include, but are not limited to, at least one precursor to generate a silica shell. The optional materials may be appropriately selected based upon the desired outer layer of the tracer particle.

The method 300 may then include applying a stimulus to the mixture 304. The stimulus may be any stimulus suitable for synthesizing core/shell magnetic structures. The stimulus may include, but is not limited to, UV radiation, heat, and chemical stimuli. The application of the stimulus oxidizes the magnetic materials in the mixture, resulting in a core/shell particle where the acoustic signal generating material is encapsulated inside a shell material, as described above. In exemplary embodiments, the method for encapsulating the acoustic signal generating material and the magnetic material in an inert shell is a sol-gel method.

In one or more particular embodiments, superparamagnetic hollow iron oxide nanoparticles (HIONs) may be the magnetic material and may be synthesized to provide response to magnetic fields without additional functionalization. In a non-limiting example of such embodiments, iron(III) chloride hexahydrate ($FeCl_3 \cdot 6H_2O$) may be dissolved in ethylene glycol and stirred by magnetic stirring. Ammonium acetate may then be added into the solution. After stirring the reaction mixture for a suitable period of time, such as for about 3 hours, the solution may then be transferred into an autoclave. The autoclave may then be incubated at an elevated temperature, for example around 200° C. for about 24 hours in an oven. After this time, the mixture may be cooled to room temperature, and the magnetic HIONs may be isolated via magnetic extraction and washed with ethanol and water. The HIONs may be dried using lyophilization for a period of time so as to remove residual water.

The synthesized HIONs may serve as the shell in which the acoustic generating material may be encapsulated. The HION powder obtained as previously described may then be vacuum sealed in a sealed vial. An acoustic signal generating material, such as a perfluorocarbon compound, may be added to the vacuum sealed HION powder. In such embodiments, the amount of perfluorocarbon added is in an appropriate amount to immerse the HION powder. The mixture of HION powder and the perfluorocarbon may then be kept at a decreased temperature for a period of time, such as around 4° C. for about 24 hours. An excess of the perfluorocarbon may then be removed, resulting in a layer of HIONs as a shell encapsulating the PCFs, i.e., a PCF-HIONs complex. The resultant PFC-HIONs complex may be encapsulated with a saline solution such that the PFC-HIONs complex is "sealed" to prevent PFC loss from diffusion of the PFC from the PFC-HIONs complex. In one or more embodiments, the PFC-HIONs complex may be encapsulated in a polymeric coating to prevent PFC loss, as described above.

In other embodiments, tracer particles may be synthesized with a magnetic core encapsulated by a silica shell. In one or more embodiments, the magnetic core may be comprised of iron oxides, carbon-encapsulated ferric magnetic colloidal nanoparticles, gadolinium ions, manganese oxides, or combinations thereof.

In one or more particular embodiments, magnetic iron oxide cores may be synthesized and embedded in mesoporous silica nanoparticles. A non-limiting example of a synthetic method is as follows. The magnetic cores may be prepared by dissolving iron(III) chloride, trisodium citrate dehydrate, and sodium acetate in ethylene glycol under magnetic stirring. The resultant homogenous mixture may be transferred to a Teflon-lined stainless-steel autoclave. The autoclave may then be heated in an air flow electric oven at elevated temperature for a period of time. After a sufficient period of time such that desired particles are produced, the solid particles may be washed with water, and dried in vacuum at sufficient time and temperature to dry residual water.

The isolated iron oxide particles may be dispersed in a mixture of ethanol, deionized water, and concentrated aqueous ammonia solution. A designated amount of orthosilicate may be added to the magnetic particles and stirred for a period of time to coat the magnetic particles. After stirring for a sufficient period of time, nonporous amorphous silica coated iron oxide ($Fe_3O_4$@$nSiO_2$) may be obtained and washed with water. The prepared $Fe_3O_4$@$nSiO_2$ spheres may be re-dispersed in a mixed solution containing a templating agent, such as cetyltrimethylammonium bromide, deionized water, ethanol, and concentrated aqueous ammonia solution. An orthosilicate may then be added and stirred at an appropriate temperature for a sufficient time to encapsulate the particles and templating agents. The product may be collected and washed with water. The products may then be incubated in water at a sufficient temperature and time. To remove the templating agents, the as-synthesized materials are extracted three times in an ethanol solution containing concentrated HCl at elevated temperatures for a sufficient period of time. To isolate the silica-based magnetic mesoporous nanoparticles, the particles may be washed with ethanol multiple times and further dried under vacuum. A desired acoustic signal generating material, such as a perfluorocarbon, may be incorporated into the vacuum dried $Fe_3O_4$@$nSiO_2$ using a procedure as described above.

The method 300 may then include suspending the resultant tracer particles in an aqueous fluid 306 to make a chemical tracer composition in accordance with one or more embodiments. As described above, the aqueous fluid may include viscosifiers and/or polymers to aid in the suspension of the tracer particles for transport downhole.

Method of Using a Chemical Tracer Composition

One or more embodiments of the present disclosure relate to a method of using the previously described inter-well chemical tracer composition to determine fluid flow paths in petroleum reservoirs.

Figure 4:
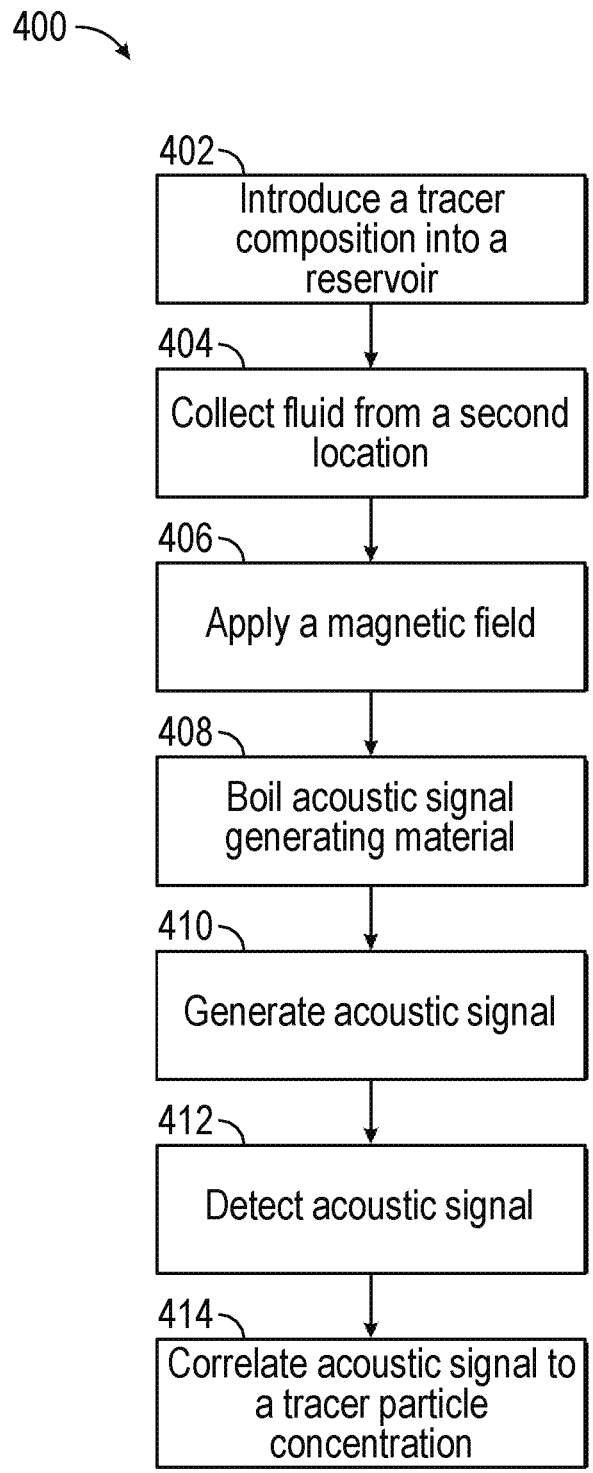
FIG. 4 is a block flow diagram of a method of determining tracer presence in collected fluid in accordance with one or more embodiments.

FIG. 4 is a flowchart showing a series of example steps for a method of analyzing a fluid extracted from a reservoir 400. In step 402, a tracer composition is introduced into a reservoir at a first location. In some embodiments, the first location is an injection well. The tracer composition includes a known concentration of tracer particles. The tracer particles may include at least one magnetic material and an acoustic signal generating material. The tracer composition further includes a carrier fluid.

In step 404, a fluid is collected (also referred to as extracted or produced) from the reservoir at a second location different from the first location. The collected fluid may include a concentration of the tracer particle that is present in the fluid following injection at the first location. The collected fluid may also include materials and compounds typically found in the earth's crust, for example: water, heavy metals (for example, iron, manganese, chromium, vanadium, or zirconium), salts (for example, potassium salts, calcium salts, magnesium salts, or sodium salts (for example, sodium chloride)), naturally occurring radioactive material (for example, uranium, thorium, radium, or radon), zinc, lead, sulfur, barium, or any combination of the previously listed components. In some embodiments, the collected fluid includes hydrocarbons (for example, hydrocarbons derived from various forms of petroleum including, but not limited to, paraffinic petroleum, paraffinic-naphthenic petroleum, naphthenic petroleum, paraffinic-naphthenic-aromatic petroleum, and aromatic petroleum) and polyaromatic hydrocarbons.

The collected fluid generally includes a quantity (that is, a concentration) of the tracer particles. Optionally, a separation procedure can be performed on the collected fluid to isolate portions of the collected fluid from one another to facilitate analysis of the tracer particles. In one or more embodiments, a separation of the tracer particle from one or more of the other components in the fluid is performed, for example to reduce or eliminate acoustic contributions from the other components of the collected fluid during measurement, which is described below.

In one or more embodiments, an aqueous phase of the collected fluid may be separated from an organic phase of the produced fluid. As one of ordinary skill in the art may appreciate, the collected fluid may contain an oil fraction. In such embodiments, an aqueous layer comprising the concentration of tracer particles may be separated from the oil fraction by gravity filtration.

In general, the tracer particles are present in the aqueous phase of the produced fluid, so the aqueous phase may be analyzed to determine the concentration of tracer particles as described below. Such separation procedures may reduce potential signal dampening due to the organic phase.

The tracer particles may be further separated from the aqueous phase using techniques known in the art. A non-limiting example of the separation of the tracer particles may be through magnetic separation from a supernatant, such that an external magnet is used to concentrate tracer particles in a solution. Upon concentrating the tracer particles to a particular area near the external magnet, an amount of the supernatant may be decanted.

After the produced fluid has been collected and optional separation procedures have been performed, in one or more embodiments, the method may include applying a magnetic field 406 to the collected fluid. In some embodiments, the magnetic field may only be applied to or the aqueous phase of the collected fluid after separation procedures. Upon application of the magnetic field, the magnetic material may produce vibrational energy. The generated vibrational energy of the magnetic material may be converted to thermal energy when in contact with the acoustic signal generating material. The transfer of thermal energy to the acoustic signal generating material may heat the acoustic signal generating material to a temperature such that the acoustic signal generating material undergoes a phase change from liquid to gas, i.e., boils 408. In such embodiments, an acoustic signal is generated 410 upon boiling of the acoustic signal generating material. Once the acoustic signal is detected 412, fluid flow path information may be determined 414.

In one or more embodiments, the collected fluid containing an amount of the tracer particle, a separated portion of the fluid containing an amount of the tracer particle, or a purified portion of the fluid containing an amount of the tracer particle, may be passed through an alternating current magnetic field, such as through an electrified coil in order to produce the vibrational energy in the magnetic material.

Figure 5A:
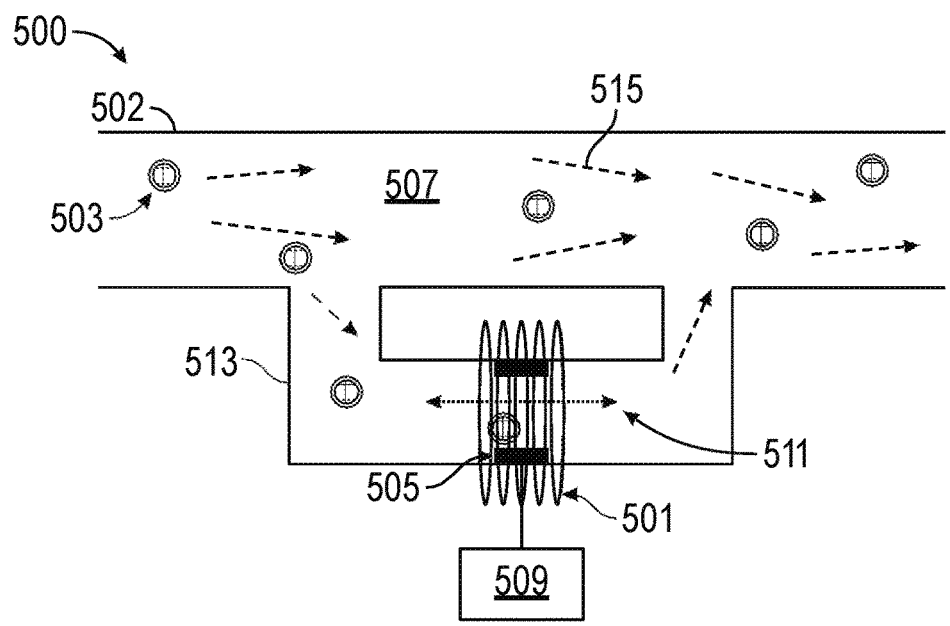
FIG. 5A is a schematic of a continuous flow system with an alternating current magnetic field in accordance with one or more embodiments.

An exemplary setup 500 for applying a magnetic field to a continuous flow of the collected fluid is shown in FIG. 5A. In some embodiments, and as shown in FIG. 5A, the aqueous phase of the collected fluid may be flowed continuously as indicated by the arrows 515. The aqueous phase 507 containing tracer particles 503 may be passed through a bypass fluid line 513 in fluid communication with a collection fluid line 502. A metal coil 501 may be positioned around the bypass fluid line 513. In such embodiments, an alternating magnetic field may be continuously applied to generate acoustic signals from the tracer particles 503. The acoustic signals generated may be detected by at least one acoustic transducer 505. The acoustic signals detected by the at least one acoustic transducer 505 may be collected and recorded on a transient digitizer 509.

Figure 5B:
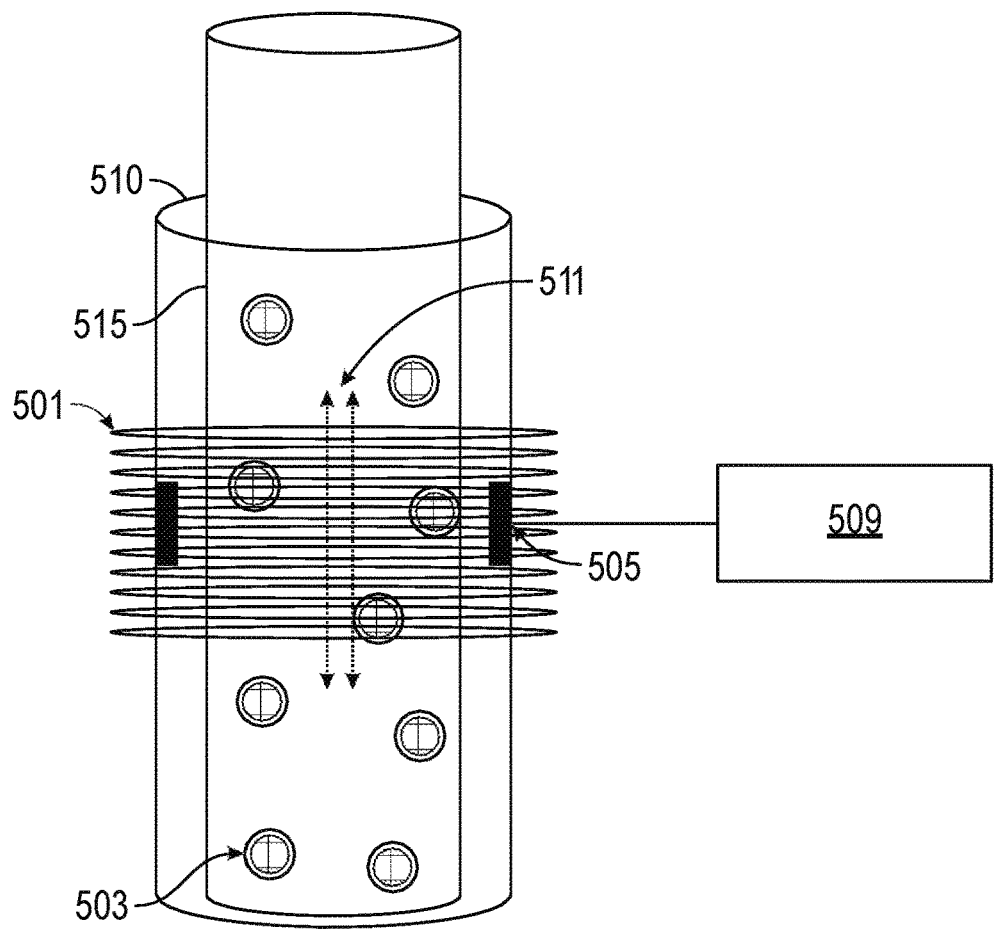
FIG. 5B is a schematic of a static sample system with an alternating current magnetic field in accordance with one or more embodiments.

In one or more embodiments, the at least one acoustic transducer 505 may be in direct contact with the aqueous phase 507 of the collected fluids. In such embodiments, the at least one acoustic transducer 505 may be configured on an internal surface of a pipe of a bypass fluid line 513, as shown in FIG. 5A. Similarly, as shown in FIG. 5B discussed in detail below, the at least one acoustic transducer 505 may be configured on an internal surface of a sample chamber 510. In such embodiments, the acoustic transducers 505 may detect an acoustic signal generated from the tracer particle 503 upon rupture instantaneously.

In one or more alternative embodiments, the at least one acoustic transducer 505 may be connected on an external surface of a sampling system, such as on the external surface of a pipe of a bypass fluid line 513 or a sample chamber 510. In such embodiments, the acoustic transducer may be connected on an external surface of a sampling system using a connector (such as a nail or screw), a connecting material (such as an adhesive), and combinations thereof.

In one or more embodiments, the tracer particles may be passed through an internal cavity of a metal coil 501. In such embodiments, the magnetic field may be generated using an electrified metal coil (or "solenoid") 501, such that an alternating magnetic field 511 is produced. The internal cavity may have a maximum internal diameter of 50 cm (centimeters). The diameter of the internal cavity may be a size such that a compatible strength of the alternating magnetic field 511 is sufficient to boil the acoustic signal generating material of the tracer particle 503.

In one or more embodiments, a magnetic field at a location inside a solenoid can be approximated by Equation 4.

$$B = \mu_0 n I \qquad \text{Eqn. (4)}$$

where B is the magnetic field at the location inside the solenoid, $\mu_0$ is a magnetic permeability of free space, n is a number of loops per unit length, which may be calculated by a total number of loops divided by the total length of the solenoid, and I is the electric current. This formula can be used to design the coil based on the desired magnitude of the magnetic field and any size constraints.

The alternating current magnetic field may produce a magnetic field sufficient to promote magnetic droplet vaporization of the acoustic signal generating material. The magnetic field required may vary based upon the type of acoustic signal generating material being used and the size of the tracer particle. In one or more embodiments, the magnetic field may range from 5 microTeslas ($\mu T$) to 5 Teslas (T). In one or more embodiments, the magnetic field magnetically activates the magnetic component of the tracer particle, thereby heating the acoustic signal generating material. The acoustic signal generating material may be heated to a temperature of from about 50° C. to about 150° C. The heating then causes the acoustic signal generating material to undergo a phase change from a liquid to a gas, which generates an acoustic signal. The acoustic signal is then detected using a suitable detection method. The acoustic signal may be sufficient to be detected using the detection methods described herein. In one or more embodiments, an optional preconcentration step may be used to concentrate the tracer particles. In such embodiments, the concentration of the tracer particles may be increased such that there may be a concurrent increase in acoustic signal upon exposure to a magnetic field.

In other embodiments, a known volume of fluid may be analyzed statically without flow as shown in FIG. 5B. Sample chamber 510 may be configured for static analysis of the collected fluid. In such embodiments, a tube containing an amount of produced fluid 515 that has been collected as described above, may be placed inside sample chamber 510. The sample chamber 510 may have a metal coil 501 wrapped around it, at least one acoustic transducer 505 inside of it, and a transient digitizer 509 connected to the acoustic transducer that may be configured to collect and record acoustic signal generation from tracer particles 503. In such embodiments, a volume of the collected fluid measured should be constant between samples for consistent analysis. The volume of the collected fluid may be collected at regular intervals for analysis, such as every 12 hours.

Referring back to FIG. 4, when sufficient energy is transferred to the tracer to cause magnetic droplet vaporization, the acoustic signal generating material generates an acoustic signal 410. In one or more embodiments, the acoustic signal generated may be detected 412 by the previously described acoustic transducer 505 and recorded by the transient digitizer 509. The generated acoustic signal may be in the Megahertz range.

Figure 6A:
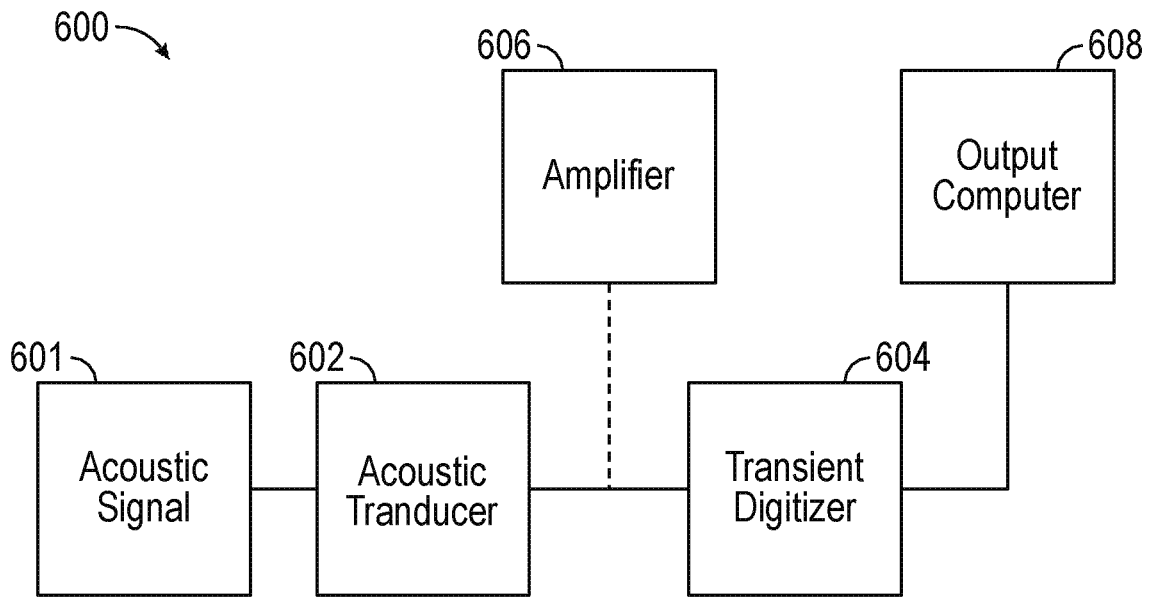
FIG. 6A is a block flow diagram of a method of processing an acoustic signal in accordance with one or more embodiments.

A block flow diagram showing a method 600 of detecting an acoustic signal in accordance with one or more embodiments of the present disclosure is shown in FIG. 6A. In one or more embodiments, the acoustic signal 601 generated from the acoustic signal generating material is detected using at least one acoustic transducer 602. In some embodiments, an array of acoustic transducers may be used to detect the acoustic signals.

Figure 6B:
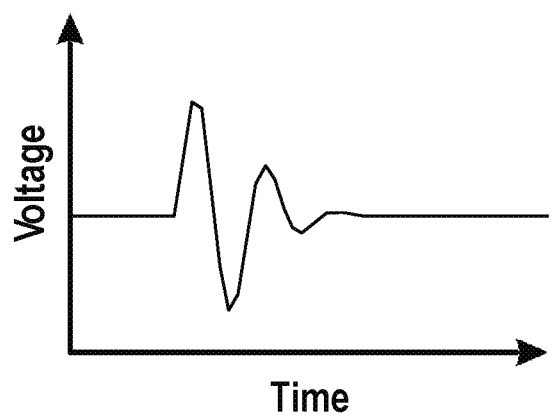
FIG. 6B is a depiction of a voltage versus time graph from a processed acoustic signal in accordance with one or more embodiments.

The acoustic transducer(s) 602 convert the acoustic signal to an electrical signal, such as a voltage, that can be measured and recorded. The acoustic transducer 602 is in electrical connection to a transient digitizer 604, such as an oscilloscope. The electrical connection may be a cable, such as a coaxial cable. In such embodiments, an amplifier 606 may optionally be included via electrical connection between the acoustic transducer 602 and the transient digitizer 604. The data output from the transient digitizer may be produced on a working computer 608. For example, the computer may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments disclosed herein. The data from the transmitted acoustic signal may be processed and displayed on the computer, such as with a voltage versus time graph (FIG. 6B). In such embodiments, the amplitude may be analyzed for correlation to concentration of the tracer particle in the sample. The acoustic signal may be analyzed using an amplitude of the acoustic signal, a frequency of the acoustic signal, or a combination thereof.

In some embodiments, the concentration of tracer particles may be estimated using a working computer 608. The working computer may generate an equation relating the peak-to-peak amplitude to a tracer particle concentration, such as a calibration curve. The calibration curve may be constructed using the aforementioned apparatus. In such embodiments, the detected acoustic signal from the fluid extracted from the second location may be analyzed with the calibration curve to determine a concentration of the tracer present in the carrier fluid extracted from the second location. In exemplary embodiments, the calibration curve of tracer particles suspended in the injection fluid is a linear calibration curve such that a linear regression may be used to identify a concentration of tracer particles from a produced fluid sample. The working computer 608 may then use a script to identify the peak-to-peak amplitude and use the equation obtained from the calibration curve to correlate the tracer particle concentration.

In FIG. 4 step 414, information is determined about fluid flow between the first location (the injection site) and the second location (the extraction site) within the reservoir based on the detected acoustic signal. The information can indicate, for example, whether a particular injection bore and extraction bore are interconnected through the reservoir, and, if connected, can also indicate how fluid flows and/or fluid flow rate through the reservoir.

For example, if a tracer is introduced into a reservoir and subsequent sample extraction from a producing bore shows the presence of the tracer, a connection exists between the point of injection and the point of extraction. Correlations between the presence of the tracer in the extracted fluid and the elapsed time between injection and detection of the tracer can also provide information about fluid flow through the reservoir. As an example, the elapsed time between injection and the appearance of the tracer in the extracted fluid (for example, in a measurement process where fluid is extracted periodically and analyzed) can provide information about the fluid flow capacity of the reservoir, the interconnectedness of flow pathways, and residual oil saturation, which is difficult to acquire directly by other means.

Figure 7:
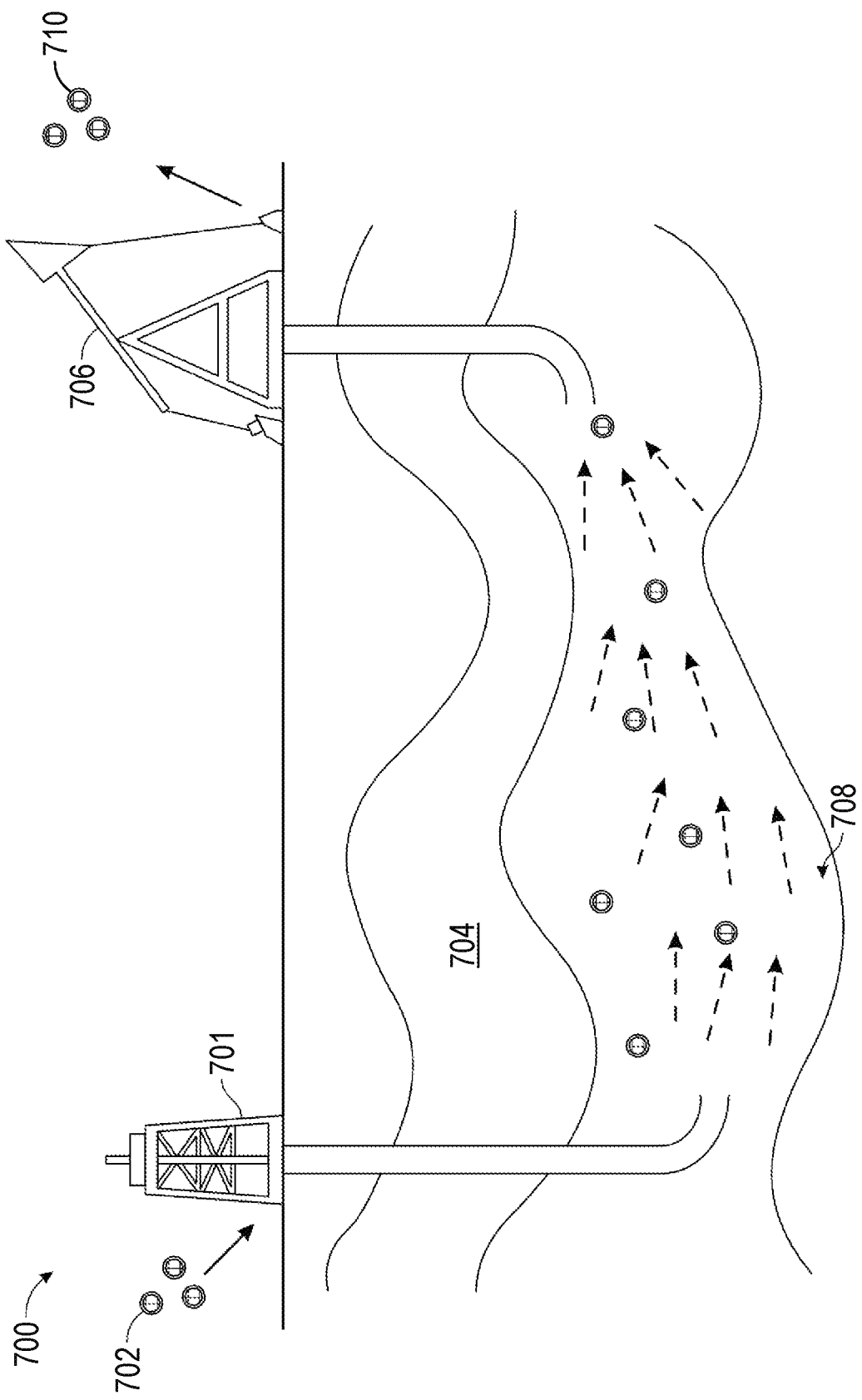
FIG. 7 is a depiction of well environment in accordance with one or more embodiments.

FIG. 7 is a schematic diagram showing an example of a reservoir system 700 in which a magnetic inter-well tracer may be used. The magnetic tracer 702 is introduced into the reservoir 704 through an injection bore at a first location 701 and propagates through at least a portion of the reservoir 708. A fluid sample is collected from a producing bore at a second location 706 different from the first location 701. The fluid sample 710, which includes the magnetic tracer particle, is subjected to the magnetic field and resultant signals are processed with an acoustic transducer. The acoustic signal generated by the phase change of the acoustic signal generating material is detected by at least one acoustic signal transducer following the end of the exposure to the magnetic field. As discussed previously, the intensity of the magnetic field is selected so that suitable vibrational energy is achieved in the magnetic materials to allow for thermal energy transfer to the acoustic signal generating material. Also mentioned previously, the measurement of the acoustic signal generated from the acoustic signal generating material of the tracer particles occurs without confounding signal contributions from background components.

Figure 8:
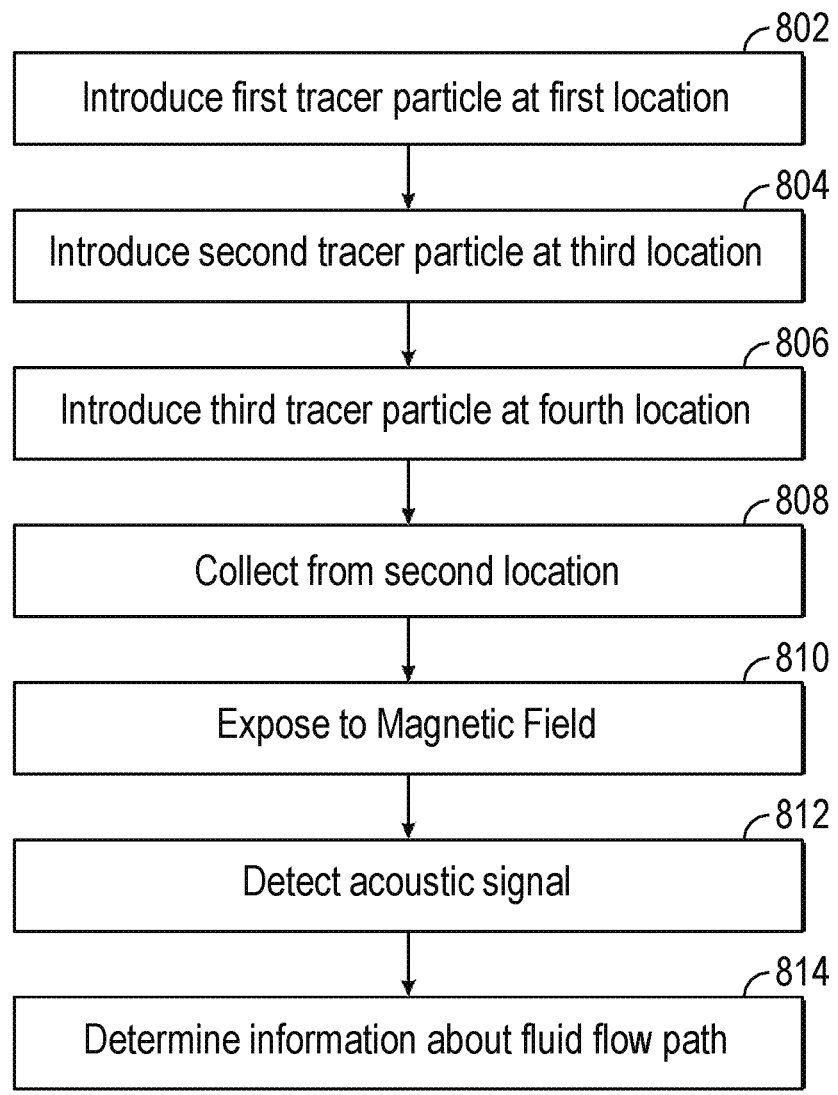
FIG. 8 is a block flow diagram of a method of determining tracer presence in collected fluid from a multi-well tracer test in accordance with one or more embodiments.

In one or more embodiments, more than one composition of the tracer particle as described in the present disclosure may be used for multi-well analysis. FIG. 8 is a flowchart showing a series of example steps of a multi-well procedure for analyzing a fluid extracted from a reservoir. In the procedure shown in FIG. 8, multiple tracer particles, each including a different distinguishing acoustic signal generating material, magnetic material, and combinations thereof, are introduced into the reservoir at different injection sites. Deployment of multiple tracer particles, each injected at a different location into a reservoir, allows determination of information about flow paths, such as flow rates, between each injection site and the producing location. In general, unless expressly stated otherwise, the features and aspects of the method of FIG. 8 are similar to those already discussed in connection with FIG. 4.

In exemplary embodiments of FIG. 8, a first tracer particle that includes a first acoustic signal generating material is introduced into a reservoir at a first location in step 802. Similarly, in steps 804 and 806, second and third compositions of tracer particles, which include a second acoustic signal generating material and a third acoustic signal generating material, respectively, are introduced into the reservoir at third and fourth locations, respectively. Each of the first, third, and fourth locations are different. Typically, at each location, the acoustic signal generating material introduced differs from the acoustic signal generating materials introduced at the other locations so that information specific to the flow path between that location and the extraction location can be determined. Each of the acoustic signal generating materials that are introduced can correspond to one of the acoustic signal generating materials discussed in a previous section.

Further, in some embodiments, step 806 is omitted and the resulting method includes the introduction of only the first and second tracer particles with first and second acoustic signal generating materials, with subsequent steps excluding the processing and presence of the third tracer particle with the third acoustic signal generating material. In step 808, a produced fluid is collected from the second location. In step 810, the produced fluid and tracer particles that may be within the produced fluid are exposed to an alternating current magnetic field to promote magnetic droplet vaporization as described above.

In one or more embodiments, the acoustic signals may then be detected 812. In exemplary embodiments, the acoustic signals may be differentiated such that interpretation of the acoustic signal may relay information relative to a selected tracer particle. In such embodiments, the differentiation may be a result of the different boiling points of the acoustic signal generating material. For example, upon exposure to the alternating magnetic field, the produced fluid may produce several acoustic signals corresponding to each of the first, third, and fourth tracer particles, respectively. In additional embodiments, an array of alternating current magnetic fields along with acoustic transducers may be established, such that a first alternating current magnetic field promotes the generation of the first acoustic signal that corresponds to the first tracer particle, which is then detected by a first acoustic transducer. The third acoustic signal may then be produced upon exposure of the producing fluid and the third tracer particle to a second alternating current magnetic field. The third acoustic signal may then be detected by a second acoustic transducer. A process similar to those described above may be used to promote the fourth tracer particle to produce the fourth acoustic signal.

In step 814, information is determined about fluid flow paths between the various injection sites of the first, third, and fourth locations by interpretation of data from the first, third, and fourth acoustic signals and the producing (or second). As discussed previously in connection with FIG. 4, this information can include concentrations of each of the tracer particles recovered at the extraction site, flow rates between the various injection sites and the extraction site, and other information about the reservoir structure.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112(f) for any limitations of any of the claims herein, except for those in which the claim expressly uses the words 'means for' together with an associated function.

What is claimed:

1. A tracer composition comprising:
   a tracer particle comprising a core surrounded by a shell and at least one magnetic material capable of vaporizing an acoustic signal generating material; and
   a carrier fluid.

2. The composition of claim 1, wherein the magnetic material is selected from the group consisting of hollow iron oxide nanoparticles, carbon-encapsulated ferric magnetic colloidal nanoparticles, gadolinium ions, manganese oxides, and combinations thereof.

3. The composition of claim 1, wherein the magnetic material is a mesoporous particle and wherein the acoustic signal generating material is in pores of the mesoporous particle.

4. The composition of claim 1, wherein a diameter of the tracer particle ranges from 100 nm (nanometers) to 1000 nm.

5. The composition of claim 3, wherein an average pore diameter of the mesoporous particle ranges from 2 to 50 nm.

6. The composition of claim 1, wherein the core of the tracer particle includes the magnetic material and the acoustic signal generating material, and the shell of the tracer particle is silica.

7. The composition of claim 1, wherein the acoustic signal generating material is a perfluorocarbon.

8. The composition of claim 7, wherein the perfluorocarbon is selected from the group consisting of perfluorohexane, perfluorohexyl bromide, perfluorooctyl bromide, perfluoro-15-crown-5-ether, and combinations thereof.

9. The composition of claim 7, wherein the perfluorocarbon has a boiling point ranging from 50° C. to 150° C.

10. The composition of claim 1, wherein an amount of acoustic signal generating material in the tracer particle ranges from 10 vol % to 30 vol % of the total tracer particle volume.

11. The composition of claim 1, wherein the carrier fluid comprises from 0.5 to 5 wt % of the tracer particle.

12. The composition of claim 1, wherein the carrier fluid comprises an additive selected from the group consisting of viscosifiers, polymers, surfactants, and combinations thereof, wherein the additive stabilizes the tracer particle in the carrier fluid.

13. A method comprising:
    introducing a tracer composition into a reservoir at a first location, wherein the tracer composition comprises:
        a tracer particle comprising at least one magnetic material and an acoustic signal generating material;
        a carrier fluid;
    collecting fluid from the reservoir at a second location, wherein the first location is different from the second location;
    applying a magnet field to the fluid collected from the reservoir such that the magnetic material produces vibrational energy, wherein due to the vibrational energy generated in the magnetic material, thermal energy is transferred to the acoustic signal generating material thereby heating the acoustic signal generating material to a boiling point of the acoustic signal generating material such that the acoustic signal is generated;
    detecting the acoustic signal; and
    correlating the acoustic signal to a tracer particle concentration.

14. The method of claim 13, further comprising, prior to the detecting a presence of the tracer particle, separating an aqueous phase from the fluid collected from the reservoir.

15. The method of claim 13, wherein the magnetic field is an alternating current magnetic field.

16. The method of claim 15, wherein the magnetic field is generated by a looped metal coil with and an alternating current power source.

17. The method of claim 13, wherein the applying the magnetic field heats the acoustic signal generating material to a temperature range of 50 to 150° C.

18. The method of claim 17, wherein the applied magnetic field ranges from 5 µT to 5T.

19. The method of claim 13, wherein the acoustic signal is detected using at least one acoustic transducer.

20. The method of claim 19, wherein the acoustic signal is analyzed using an amplitude of the acoustic signal, a frequency of the acoustic signal, or a combination thereof.

* * * * *